(12) United States Patent
Gauthier et al.

(10) Patent No.: US 6,768,955 B2
(45) Date of Patent: Jul. 27, 2004

(54) ADJUSTMENT AND CALIBRATION SYSTEM FOR POST-FABRICATION TREATMENT OF PHASE LOCKED LOOP CHARGE PUMP

(75) Inventors: Claude R. Gauthier, Fremont, CA (US); Brian W. Amick, Austin, TX (US); Dean Liu, Sunnyvale, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 50 days.

(21) Appl. No.: 10/147,707

(22) Filed: May 17, 2002

(65) Prior Publication Data

US 2003/0214333 A1 Nov. 20, 2003

(51) Int. Cl.[7] ............................................... G01R 23/00
(52) U.S. Cl. ....................................................... 702/75
(58) Field of Search .............................. 702/75, 72, 64, 702/106; 324/76.52, 76.53, 76.77, 76.75; 327/156, 157, 362, 363, 536

(56) References Cited

U.S. PATENT DOCUMENTS 5,631,587 A * 5/1997 Co et al. ..................... 327/107
6,049,255 A * 4/2000 Hagberg et al. ............... 331/17
6,570,421 B1 * 5/2003 Gauthier et al. ............ 327/156
6,570,423 B1 * 5/2003 Trivedi et al. .............. 327/157
6,593,784 B1 * 7/2003 Gauthier et al. ............ 327/156
6,597,218 B1 * 7/2003 Gauthier et al. ............ 327/158

OTHER PUBLICATIONS

"Low–Jitter Process–Independent DLL and PLL Based on Self–Biased Techniques," by John G. Maneatis, IEEE Journal Solid–State Circuits, vol. 31, No. 11, Nov. 1996 (10 pgs).

* cited by examiner

Primary Examiner—Michael Nghiem
(74) Attorney, Agent, or Firm—Osha & May L.L.P.

(57) ABSTRACT

An adjustment and calibration system for post-fabrication treatment of a phase locked loop charge pump is provided. The adjustment and calibration system includes at least one adjustment circuit, to which a phase locked loop charge pump output is responsive, and a storage device that selectively stores control information (1) associated with a state of the adjustment circuit and/or (2) from a tester that writes such control information to the storage device, where the control information stored in the storage device is subsequently selectively read out in order to adjust the adjustment circuit to a state corresponding to the control information.

21 Claims, 10 Drawing Sheets

ADJUSTMENT AND CALIBRATION SYSTEM FOR POST-FABRICATION TREATMENT OF PHASE LOCKED LOOP CHARGE PUMP

BACKGROUND OF INVENTION

Figure 1:
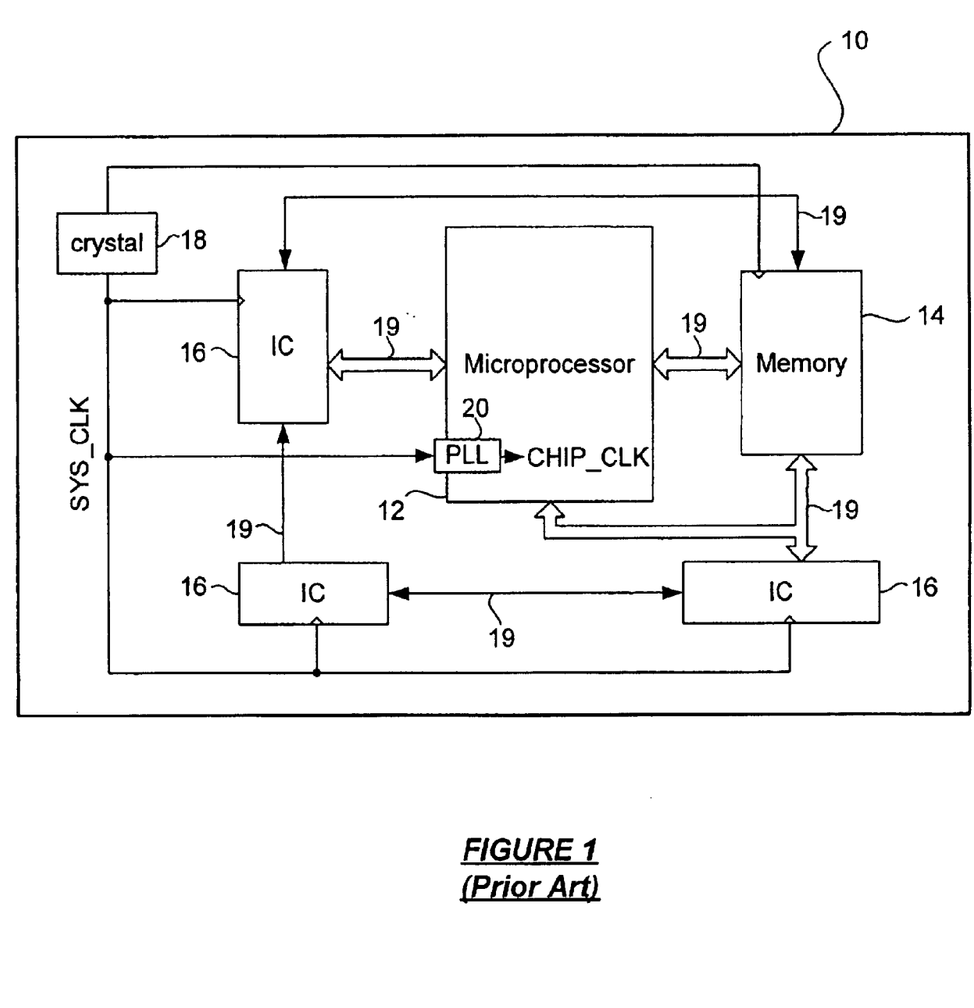
FIG. 1 shows a typical computer system.

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (also referred to and known in the art as "reference clock"), SYS_CLK, to various parts of the computer system 10. Modern microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

One component used within the computer system 10 to ensure a proper reference of time among a system clock and a microprocessor clock, i.e., "chip clock," is a type of clock generator known as a phase locked loop, or "PLL" 20. The PLL 20 is an electronic circuit that controls an oscillator such that the oscillator maintains a constant phase relative to a reference signal. Referring to FIG. 1, the PLL 20 has as its input the system clock, which is its reference signal, and outputs a chip clock signal, CHIP_CLK, to the microprocessor 12. The system clock and chip clock have a specific phase and frequency relationship controlled by the PLL 20. This relationship between the phases and frequencies of the system clock and chip clock ensures that the various components within the microprocessor 12 use a controlled and accounted for reference of time. When this relationship is not maintained by the PLL 20, however, the operations within the computer system 10 become non-deterministic.

Figure 2:
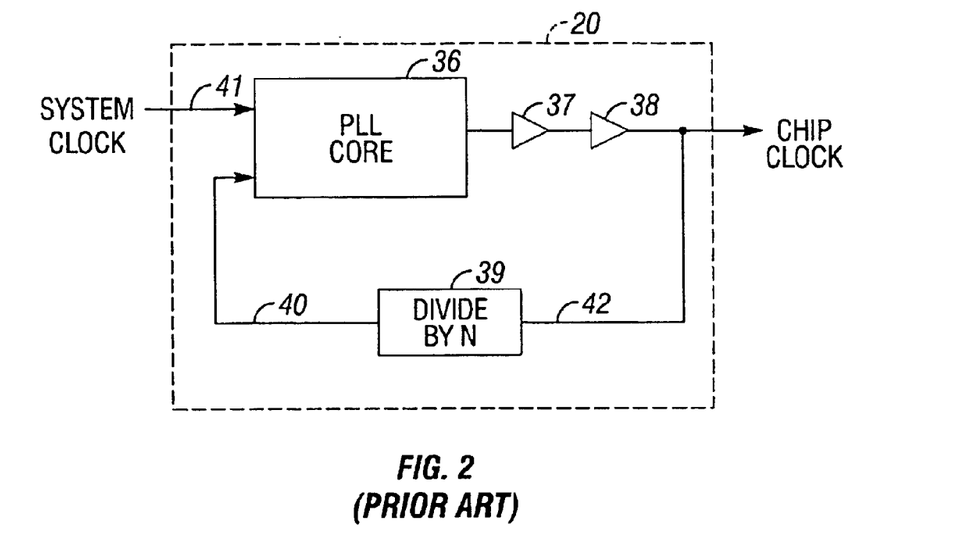
FIG. 2 shows a block diagram of a typical phase locked loop.

FIG. 2 shows a diagram of a typical PLL 20. The PLL 20 includes a feedback loop that aligns the transition edge and frequency of a system clock, SYS_CLK 41, and a feedback loop signal, FBK_CLK 40. The PLL 20 adjusts the output frequency in order to zero any phase and frequency difference between the system clock 41 and the feedback loop signal 40. The addition of a divide-by-N stage 39 in the feedback loop enables the PLL 20 to generate an output that has a frequency of N times the system clock 41 frequency. Multiplying the system clock 41 is necessary when a chip clock, CHIP_CLK 42, must have a higher frequency than the system clock 41. The PLL core 36 adjusts the output frequency in order to zero any phase and frequency difference between the system clock 41 and the feedback loop signal 40. By adding the divide-by-N stage 39, the chip clock 42 must be N times faster to allow the phase and frequency difference between the system clock 41 and the feedback loop signal 40 to zero. The PLL 20 may also have buffers 37 and 38 to drive a larger resistive and/or capacitive load. The buffers 37 and 38 are in the feedback loop so that any phase shift created by the buffers 37 and 38 is zeroed by the PLL core 36.

One common performance measure for a PLL is jitter. Jitter is the time domain error from poor spectral purity of an output. In other words, in a repeated output pattern, such as a clock signal, a transition that occurs from one state to another does not happen at the same time relative to other transitions. Jitter represents the perturbations that result in the intermittent shortening or lengthening of signal elements of an output. The system clock may have jitter that may need to be filtered by the PLL. The PLL may need to follow and compensate for jitter at the PLL output.

Phase locked loops are basically second order feedback control systems. As such, the phase locked loop can be described in the frequency domain as having a damping factor and natural frequency. The damping factor and natural frequency are fixed by the selection of the PLL circuit parameters. The loop bandwidth is defined as the PLL input frequency at which the PLL output magnitude is 3 dB lower than the PLL output magnitude when the PLL input frequency is zero (DC). The loop bandwidth determines to a large degree the speed at which the phase locked loop can react to a disturbance. The PLL should have a low loop bandwidth so that input clock jitter is filtered. Power supply noise will, however, have a certain noise-versus-frequency characteristic. The PLL loop bandwidth may need to be increased to recover from the generation of output jitter caused by power supply noise.

SUMMARY OF INVENTION

According to one aspect of the present invention, an integrated circuit comprises: a power supply; a phase locked loop, operatively connected to the power supply, arranged to receive a system clock signal and output a chip clock signal, where the phase locked loop includes a phase frequency detector adapted to detect a phase difference between the system clock signal and a feedback clock signal, a charge pump (responsive to the phase frequency detector) adapted to output a current on a control signal, a bias generator (responsive to the control signal) adapted to generate a bias voltage, and a voltage controlled oscillator (responsive to the bias voltage) adapted to generate the chip clock signal; an adjustment circuit of which an output is operatively connected to the charge pump, where current output from the charge pump is responsive to the adjustment circuit; and a storage device adapted to store control information, where the adjustment circuit is selectively responsive to the control information.

According to another aspect, an integrated circuit comprises: power supply means for supplying power; phase locked loop means for receiving an input clock signal and outputting an output clock signal, where the power supply means is operatively connected to the power supply means, and where the phase locked loop means includes comparing means for detecting a phase difference between the input clock signal and a feedback clock signal, charge pumping means (responsive to the comparing means) for outputting a current on a control signal, bias generating means (responsive to the control signal) for generating a bias voltage, and oscillating means (responsive to the bias voltage) for outputting the output clock signal; adjusting means for adjusting the current output of the charge pumping means; and storing means for storing control information to which the adjusting means is selectively responsive.

According to another aspect, a method for post-fabrication treatment of a phase locked loop comprises: detecting a phase difference between an input clock signal and a feedback clock signal of the phase locked loop; generating a current on a control signal based on the detected phase difference; generating a bias voltage based on the control voltage; generating an output clock signal based on the bias voltage; selectively adjusting the current on the control signal; and storing at least a portion of control information determined from the selectively adjusting in a storage device, where the selectively adjusting is based on the at least a portion of the control information.

Other aspects and advantages of the invention will be apparent from the following description and the appended claims.

BRIEF DESCRIPTION OF DRAWINGS

FIG. 6b shows a timing diagram for the storage device shown in FIG. 6a.

DETAILED DESCRIPTION

Figure 3A:
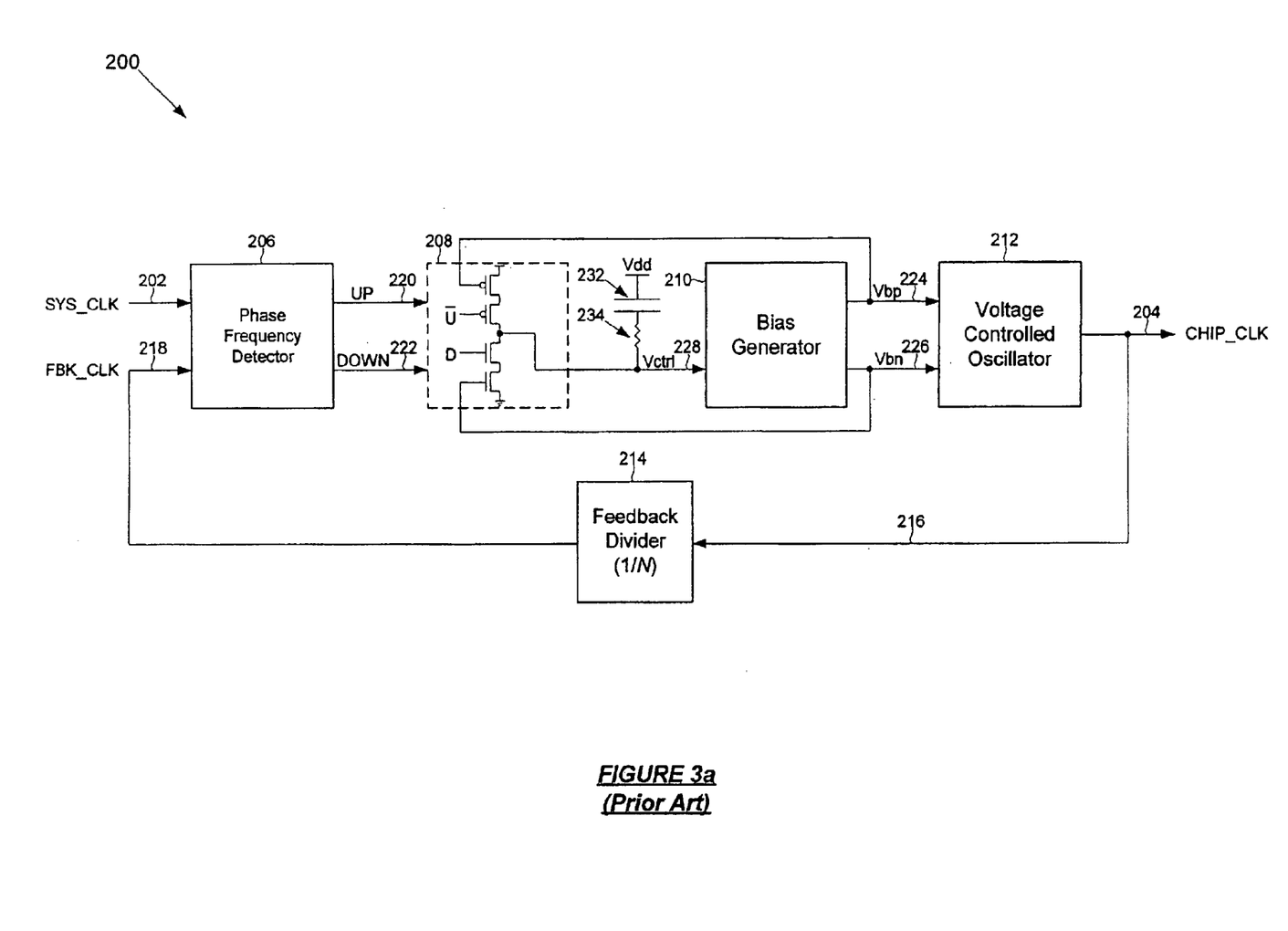
FIG. 3a shows a circuit diagram of a phase locked loop.

FIG. 3a shows a diagram of a PLL 200. A system clock, SYS_CLK 202, serves as an input to the PLL 200 and is used to create a phased output, chip clock 204. The basic elements of the PLL 200 are a phase frequency detector 206, a charge pump 208, a loop filter (discussed below), and a voltage controlled oscillator 212. Because the chip clock 204 is typically desired to have a significantly higher frequency than the system clock 202, a divide-by-N circuit 214 is positioned in a feedback loop 216 of the PLL 200. The divide-by-N circuit 214 is used to reduce, i.e., divide down, the frequency of the chip clock 204 so that the system clock 202 can be compared with a feedback clock, FBK_CLK 218.

The phase frequency detector 206 measures the phase and frequency difference between the system clock 202 and the feedback clock 218. Based on the comparison, the phase frequency detector 206 generates UP and DOWN signals 220 and 222 that control the charge pump 208 by causing the charge pump 208 to increase or decease the net charge at an output of the charge pump 208. Furthermore, as shown in FIG. 3a, an internal biasing of the charge pump 208 is dependent on bias signals, Vbp 224 and Vbn 226, generated by the bias generator 210. The charge pump 208 is arranged as such to guarantee that the charge pump 208 has some nominal current. Thus, depending on the UP and DOWN signals 220 and 222 and Vbp 224 and Vbn 226, the charge pump 208 adds or removes charge from a control voltage, Vctrl 228. The control voltage is further dependent on a loop filter formed by a capacitance 232 and a resistance 234.

The control voltage 228 serves as an input to the bias generator 210, which, as mentioned above, generates bias signals Vbp 224 and Vbn 226. Bias signals Vbp 224 and Vbn 226 are used to control the voltage controlled oscillator 212, which, in turn, generates the chip clock 204, where the chip clock 204 has a frequency in relation to the bias signal inputs to the voltage controlled oscillator 212.

Those skilled in the art will note that because the input(s) to the voltage controlled oscillator 212 may be susceptible to power supply noise, the chip clock 204 may jitter. Accordingly, the amount of capacitance 232 in the loop filter helps determine how much of the power supply noise affects the voltage controlled oscillator 212.

Figure 3B:
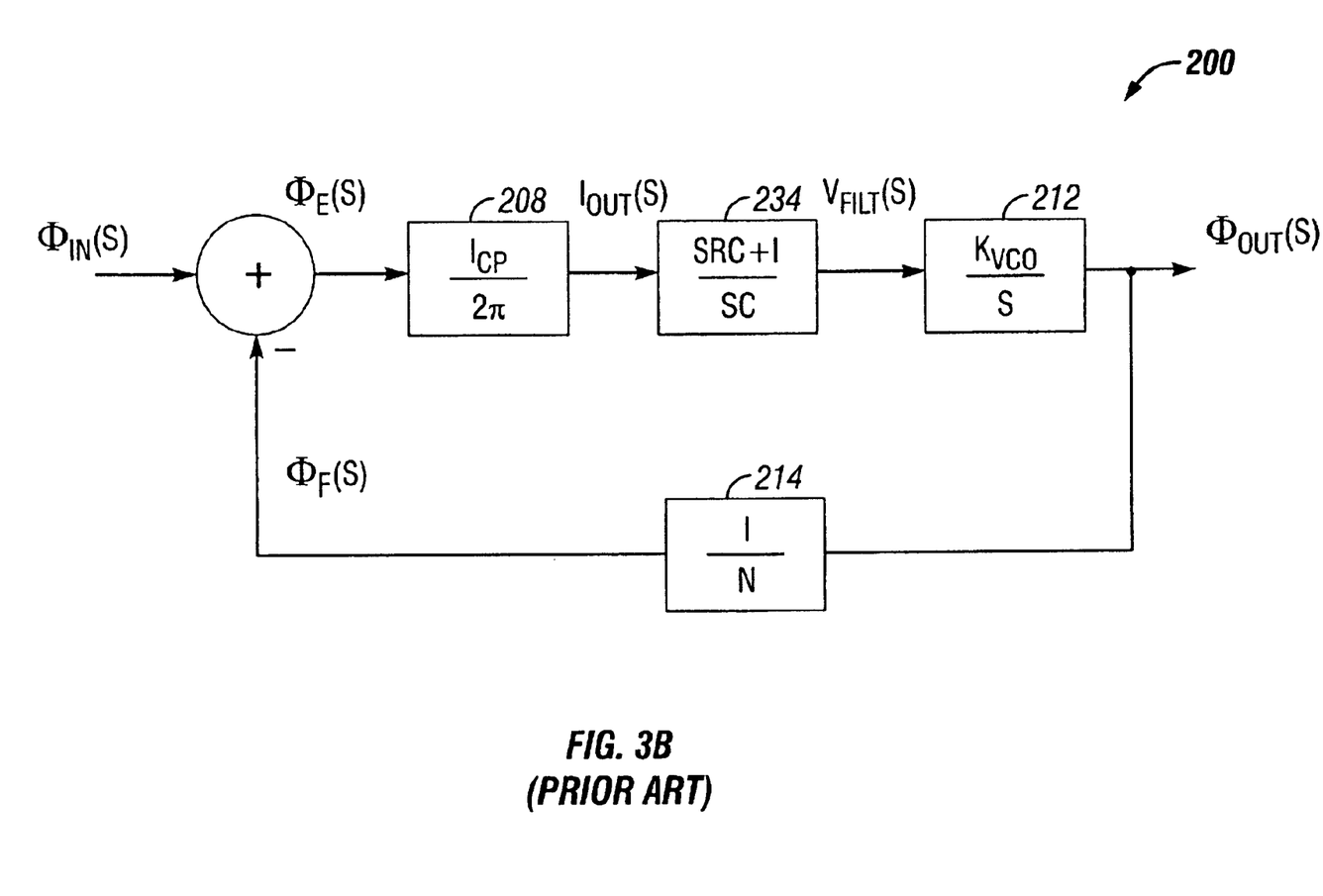
FIG. 3b shows a control diagram of a phase locked loop.

In FIG. 3b, the frequency response of the PLL 200 may be analyzed with a Laplace transform approximation, where the sample operation of the phase-frequency detector is ignored. This approximation is useful for loop bandwidths about a decade or more below the operating frequency of the PLL. This loop bandwidth constraint is also required for stability due to the reduced phase margin near the higher order poles that result from the delay around the sampled feedback loop. The modeled charge pump 208 adds or removes charge to its output depending on the state of input control pulse signals UP and DOWN 220 and 222 (shown in FIG. 3a). Both pulses may be 'on' at the same time, however, if one of the UP 220 and DOWN 222 pulse remains 'on' longer than the other, the net charge at the output of the charge pump 208 accordingly increases or decreases. The charge pump gain may be modeled as a linear gain versus phase error where $I_{OUT}(s)/\Phi_E(s)=I_{CP}/2\pi$. A loop filter 234 of the PLL may be modeled as a series combination of a capacitor, C, and a resistor, R, connected from $I_{OUT}$ to ground. The loop filter 234 transforms the output of the charge pump 208, $I_{OUT}$, into the voltage-controlled oscillator input voltage, $V_{FILT}$. The Laplace transform of the series resistor and capacitor in the loop filter 234 is $V_{FILT}(s)/I_{OUT}(s)=(sRC+1)/(sC)$. The transfer function of the capacitor and resistor shows that a zero is added that adds stability to the PLL loop. The voltage controlled oscillator 212 outputs a clock that has a frequency proportional to the input voltage $V_{FILT}$. The Laplace transform of the voltage controlled oscillator 212 is $\Phi_{OUT}(s)/V_{FILT}(s)=I_{CP}/V_{FILT}(s)=K_{VCO}/S$. The closed-loop transfer funtion can now be derived as $H(s)=\Phi_{OUT}(s)/\Phi_{IN}(s)=[(RK_{VCO}I_{CP}/2\pi)/(s+1/RC)]/[S^2+sRCK_{VCO}I_{CP}/2\pi NC+K_{VCO}I_{CP}/2\pi NC]$. H(s) is a second order system that has one pole from the loop filter 234 and one pole from the voltage controlled oscillator 212, and one zero from the resistor, R, in the loop filter 234. The transfer function H(s) has a natural frequency $\omega_n=(K_{VCO}I_{CP}/2\pi NC)^{0.5}$ and a damping factor $\zeta=RC\omega_n/2$.

The loop bandwidth is defined as the frequency at which the output magnitude is 3 dB lower than when the input is DC. Loop bandwidth is not the same as natural frequency, although they are often close. Once $\zeta$, $\omega_n$, $K_{VCO}$, and $I_{CP}$ are chosen, the values for R and C can be determined for any selected loop bandwidth. Low loop bandwidth allows the PLL to filter input error. High loop bandwidth allows the PLL to follow and compensate for output error induced by power supply noise. Thus, a design tradeoff must be made in the loop bandwidth of the PLL. The value for C has a large effect on loop bandwidth and natural frequency. Optimizing the PLL loop bandwidth relates to balancing the effect and treatment of input error with the PLL loop's speed of response to compensate for output error induced by power supply noise.

As partly discussed above, in a PLL, jitter may be a function of various parameters: power supply variation, input and output error, loop bandwidth, substrate noise, etc. Although a designer may intend for an integrated circuit to have particular values for these parameters, most of the actual values for these parameters are unknown until the integrated circuit has been fabricated (i.e., is in a post-silicon or post-fabrication stage). For example, with respect to the loop dynamics of a PLL (i.e., how quickly the PLL corrects its output), a designer may intend for the loop bandwidth to operate in a particular frequency range. Unfortunately, the loop bandwidth may be affected by many process technology factors in the fabrication process. Because the PLL cannot be redesigned in the post-fabrication stage without considerable temporal and monetary expenditures, these constraints may cause the PLL to have a different operating frequency range than designed and poor jitter performance.

Embodiments of the present invention relate to an adjustment and calibration system for post-fabrication treatment of a phase locked loop charge pump. As explained in detail below, the adjustment and calibration system includes at least one adjustment circuit, to which a phase locked loop charge pump output is responsive, and a storage device that selectively stores control information (1) associated with a state of the adjustment circuit and/or (2) from a tester that writes such control information to the storage device, where the control information stored in the storage device is subsequently selectively read out in order to adjust the adjustment circuit to a state corresponding to the control information.

Those skilled in the art will note that the current of a charge pump within a PLL is directly related to the loop bandwidth of the PLL. In other words, the current of the charge pump directly affects the rate at which the PLL can react to disturbances.

Exemplary embodiments of the invention will be now described with reference to the accompanying drawings. Like items in the drawings are shown with the same reference numbers through the figures.

Figure 4:
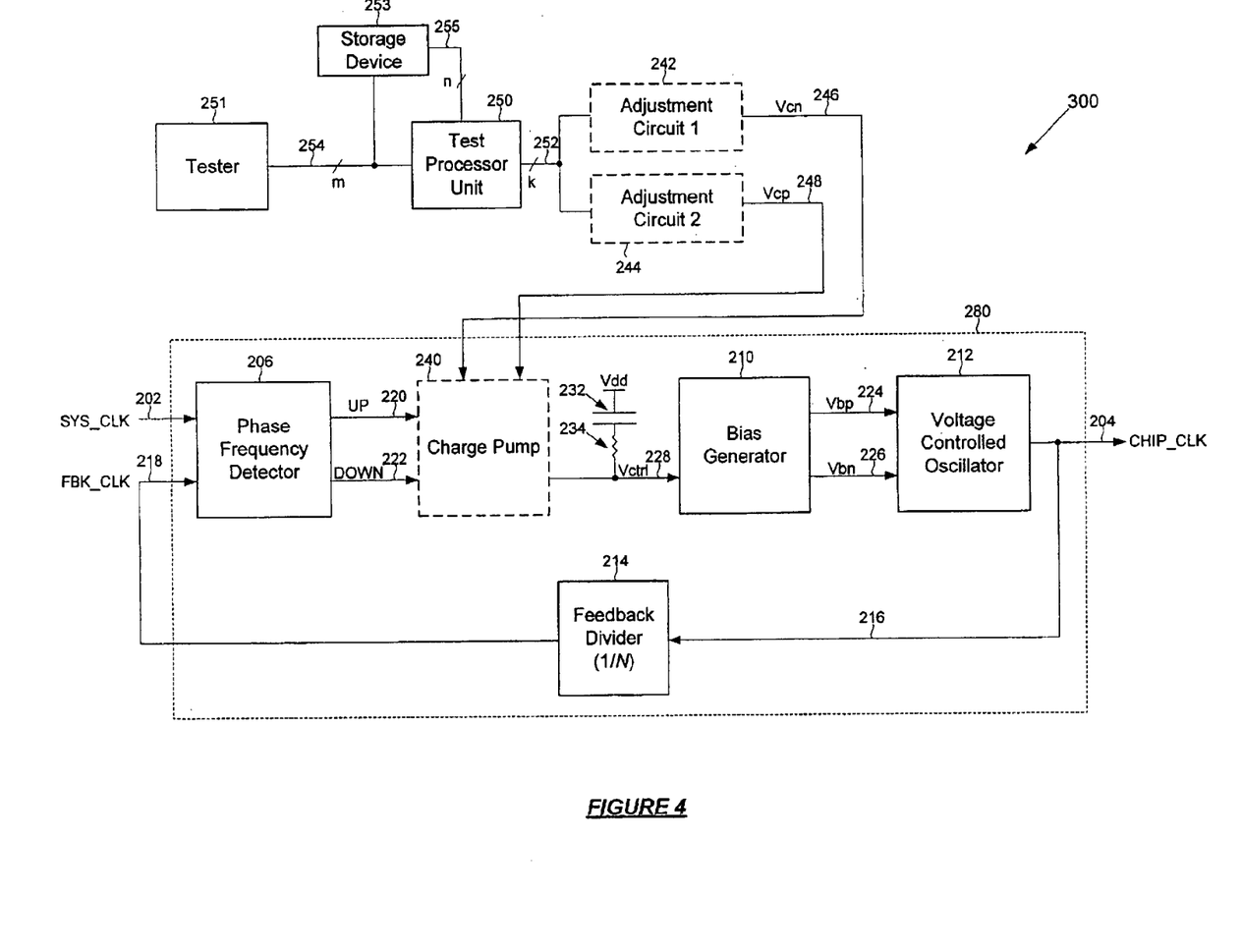
FIG. 4 shows a phase locked loop adjustment and calibration system in accordance with an embodiment of the present invention.

FIG. 4 shows an exemplary phase locked loop 280 post-fabrication adjustment and calibration system 300 in accordance with an embodiment of the present invention. In FIG. 4, the phase frequency detector 206, the capacitor 232, the resistor 234, the bias generator 210, the voltage controlled oscillator 212, and the divide-by-N circuit 214 operate similarly to the corresponding components shown in the PLL 200 of FIG. 3a.

In FIG. 4, adjustment circuits 242 and 244 are operatively connected to a charge pump 240 via adjustment control voltages Vcn 246 and Vcp 248, respectively, where the adjustment circuits 242 and 244 are controllable to adjust adjustment control voltages Vcn 246 and Vcp 248 in order to adjust internal biasing voltages within the charge pump 240, thereby adjusting the current output of the charge pump 240. As is apparent from FIG. 4, the charge pump 240 is responsive to adjustment control voltages Vcn 246 and Vcp 248 and is not responsive to bias signals Vbp 224 and Vbn 226 (as it was as shown in FIG. 3a). A detailed discussion of the charge pump 240 is given below with reference to FIG. 8.

In FIG. 4, a test processor unit 250 controls the adjustment circuits 242 and 244 using k control signals 252. The values of the k control signals 252 are determined by the test processor unit 250. The test processor unit 250 may communicate through a host interface (not shown) using m communication lines 254. Those with ordinary skill in the art will appreciate that the host interface and m communication lines 254 may take a wide variety of forms. For example, the communication may be defined by an industry standard such as JTAG (IEEE 1149).

The host interface (not shown) may be used to operatively connect to a separate computer system. For example, a tester 251 may communicate with the test processor unit 250. The tester 251 may control the test processor unit 250 to adjust adjustment circuit 242 and/or adjustment circuit 244 to modify an operating characteristics of the PLL 280. Moreover, the tester 251 may measure an operating characteristic of the PLL 280 or a representative operating characteristic of an integrated circuit on which the PLL 280 resides to determine the effect of the adjustment.

Those skilled in the art will understand that a variety of different adjustments may be made in an effort to identify the adjustment settings that produce the desired operating characteristics of the PLL 280. For example, the tester 251 may be used to adjust the PLL 280 until a desired clock signal jitter performance is achieved. In another example, the tester 251 may be used to adjust the PLL 280 until a desired power supply jitter performance is achieved. Further still, the tester 251 may be used to adjust the PLL 280 until desired operating characteristics of the PLL 280 reach a desired performance level. In this case, the operating characteristics may include jitter response, maximum operating frequency, minimum operating frequency, lock time, etc.

As shown in FIG. 4, a storage device 253 (discussed in detail below with reference to FIG. 6a) may be used to maintain control information representative of the adjustment settings (as discussed above) that produce desired operating characteristics of the PLL 280. Using the tester 251, control information may be written into the storage device 253. The tester 251 may read or rewrite the control information in the storage device 253.

In one or more embodiments, the storage device 253 may include multiple storage elements such that the control information may be represented by a binary word. For example, the control information stored in the storage device 253 may be a binary word that corresponds to values of the k control signals 252. Alternatively, the control information may be a binary encoded word. For example, if the k control signals 252 uses eight control signals, the control information might be represented with a three bit binary word. Further still, the control information may contain instructions, interpreted by the test processor unit 250, to control the k control signals 252.

In one or more embodiments, the PLL 280, or the integrated circuit on which the PLL 280 resides, may be removed from the tester 251. The test processor unit 250, via n signal lines 255, may read the storage device 253 to obtain the control information and determine the amount of adjustment that should occur in adjustment circuit 242 and/or adjustment circuit 244. Accordingly, the PLL 280, after the test processor unit 250 reads the control information in the storage device 253 and adjusts the adjustment circuit 242 and/or adjustment circuit 244, may have an operating characteristic similar to the operating characteristics obtained while connected to the tester 251.

Figure 5:
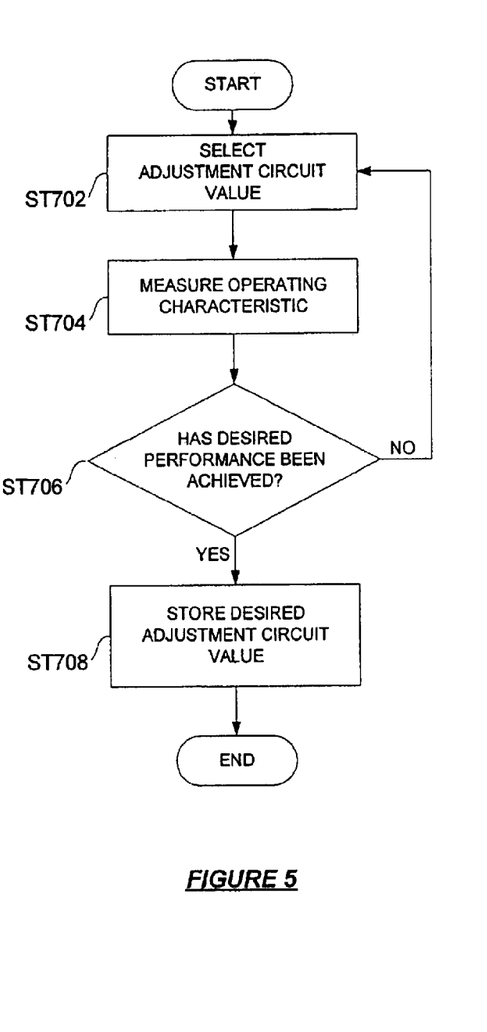
FIG. 5 shows a flow process in accordance with an embodiment of the present invention.

FIG. 5 shows a flow process in accordance with an embodiment of the present invention. In step 702, an adjustment circuit value is selected. The selected adjustment value is used to adjust one or more of adjustment circuits 242 and 244 (shown in FIG. 4). The adjustment circuits 242 and 244 are used to create an offset in the current output of the charge pump 240 (shown in FIG. 4). The adjustment of the current output of the charge pump 240 modifies an operating characteristic of the PLL 280 (shown in FIG. 4). For example, the jitter of the PLL 280 may be measured as the system clock 202 (shown in FIG. 4) is jittered or power supply noise is modified. Also, the performance of other circuits that rely on the PLL 280 may be measured. In step 704, the operating characteristics that ensue from an adjustment of the PLL 280 based on the adjustment circuit value is measured.

In step 706, a determination is made as to whether a desired performance level is achieved. The determination may be based on an actual measurement taken with the selected adjustment circuit value, or an interpolation or extrapolation from data obtained from selectively adjusting the adjustment circuit value. If the desired performance level is not achieved, steps 702 and 704 are repeated until a desired adjustment circuit value and performance level is achieved. If the desired performance level is achieved, the corresponding adjustment circuit value, or a representation of the value, is stored in step 708. The desired adjustment circuit value, or representation of the value, is the control information stored in the storage device 253 (shown in FIG. 4). As discussed above, the storage device 253 can be used to store control information that may be accessed and used to improve the performance of the PLL 280 after fabrication.

Figure 6A:
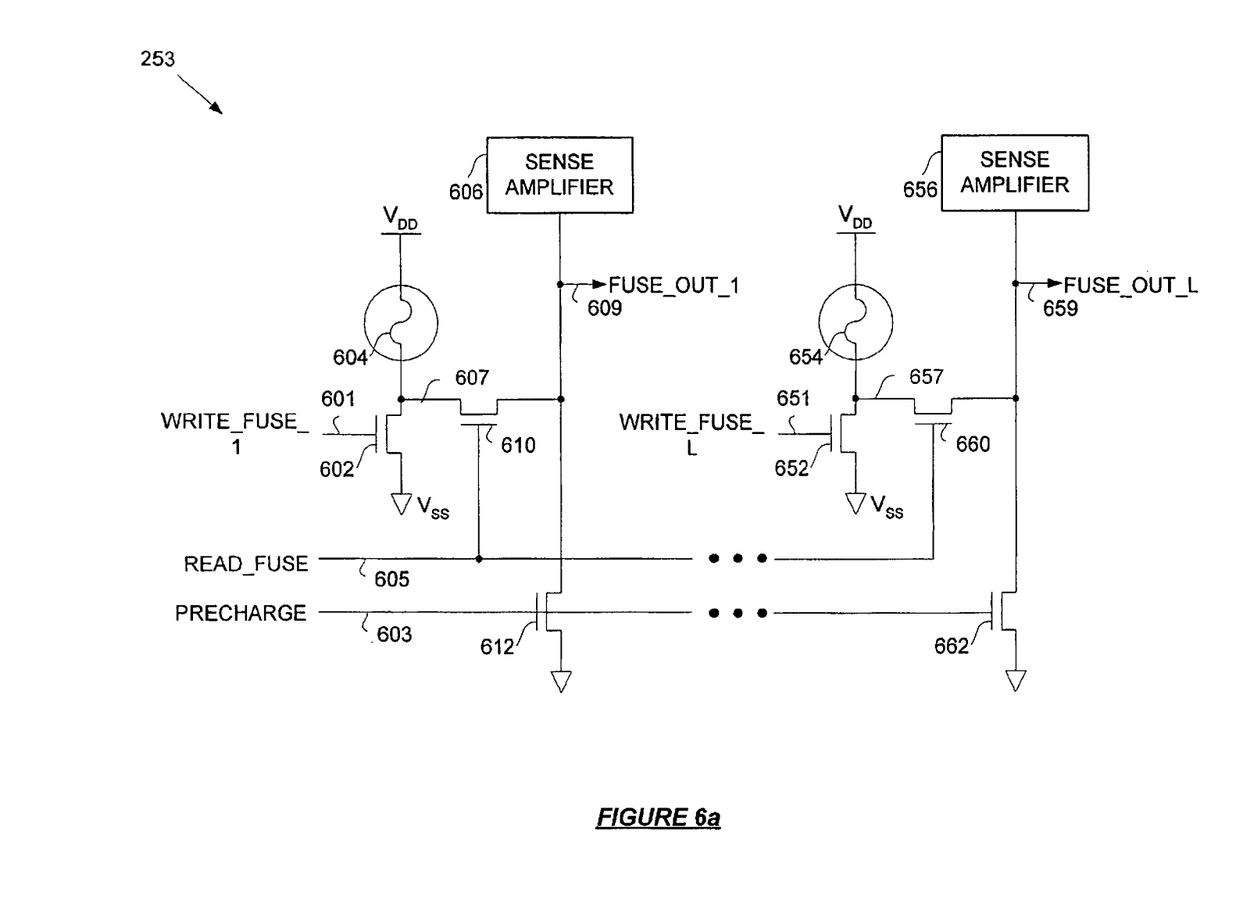
FIG. 6a shows a storage device in accordance with an embodiment of the present invention.

FIG. 6a shows an exemplary storage device 253 in accordance with an embodiment of the present invention. The storage device 253 includes electrically programmable fuses 604 and 654 to store nonvolatile control information. Multiple write signals, such as WRITE_FUSE_1 601 through WRITE_FUSE_L 651, are used to program electrically programmable fuses 604 and 654, respectively. A "high" voltage on WRITE_FUSE_1 601 and WRITE_FUSE_L 651 cause n-channel transistors 602 and 652, respectively, to turn "on." If n-channel transistors 602 and 652 are "on" for a sufficient duration, the fuse 604 and fuse 654, respectively, create an "open" circuit. A PRECHARGE signal 603 pulses "high" on the gates of n-channel transistors 612 and 662 to momentarily turn them "on." If n-channel transistors 612 and 662 are "on," FUSE_OUT_1 609 and FUSE_OUT_L 659 is pulled "low" n-channel transistors 612 and 662. The "low" voltage on FUSE_OUT_1 609 and FUSE_OUT_L 659 precharge FUSE_OUT_1 609 and FUSE_OUT_L 659 in anticipation of a read operation.

A "high" voltage on READ_FUSE 605 causes n-channel transistors 610 and 660 to turn "on." If any of the fuses 604 and 654 are intact, i.e., shorted, FUSE_OUT_1 609 and FUSE_OUT_L 659 are respectively pulled "high." If any of the fuses 604 and 654 are open, FUSE_OUT_1 609 and FUSE_OUT_L 659 remain "low." The sense amplifiers 606 and 656 sense the voltage levels on FUSE_OUT_1 609 and FUSE_OUT_L 659, respectively, to amplify and maintain the voltage levels.

Figure 6B:
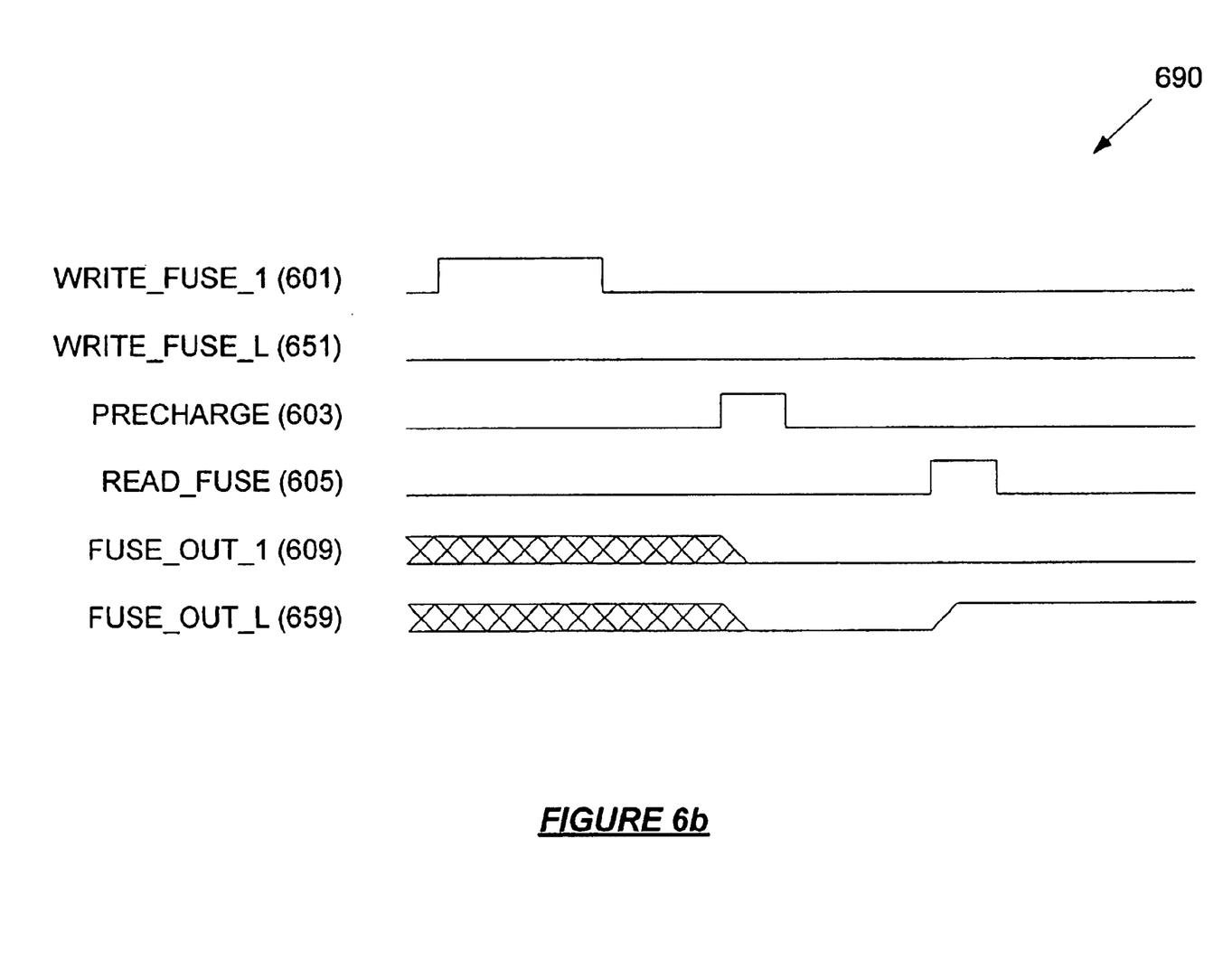

FIG. 6b shows a timing diagram 690 related to the programming of storage device 253 in accordance with an embodiment of the present invention. In this example, WRITE_FUSE_1 601 is pulsed to a "high" voltage to create an "open" on fuse 604. WRITE_FUSE_L 651 remains at a "low" voltage to leave fuse 604 intact. PRECHARGE 603 pulses "high" to pull FUSE_OUT_1 609 and FUSE_OUT_L 659 to a "low" voltage. READ_FUSE 605 pulses "high" to read the state of the fuses 604 and 654. Because fuse 604 is "open," FUSE_OUT_1 609 remains at a "low" voltage. Because fuse 654 is intact, or "shorted," FUSE_OUT_L 659 is pulled "high."

Because the fuses 604 and 654 have been programmed and read, FUSE_OUT_1 609 and FUSE_OUT_L 659 maintain the programmed control information. The state of the fuses 604 and 654 may be read at any time by observing the voltage level on FUSE_OUT_1 609 and FUSE_OUT_L 659. Also, the state of the fuses 604 and 654 may be read by repeating the precharge and read cycles. Using multiple fuses and related circuitry, a binary word may represent the stored control information.

One of ordinary skill in the art will appreciate that the electrically programmed fuses are but one method to store information. Those skilled in the art will appreciate that the storage device 253 may contain a wide variety of types of storage elements including, but not limited to, an electrically programmed fuse, an electrically programmed read only memory (EPROM), an electrically erasable read only memory, a one time programmable memory, a flash memory, a laser programmed fuse, and a laser programmed anti-fuse.

Figure 7:
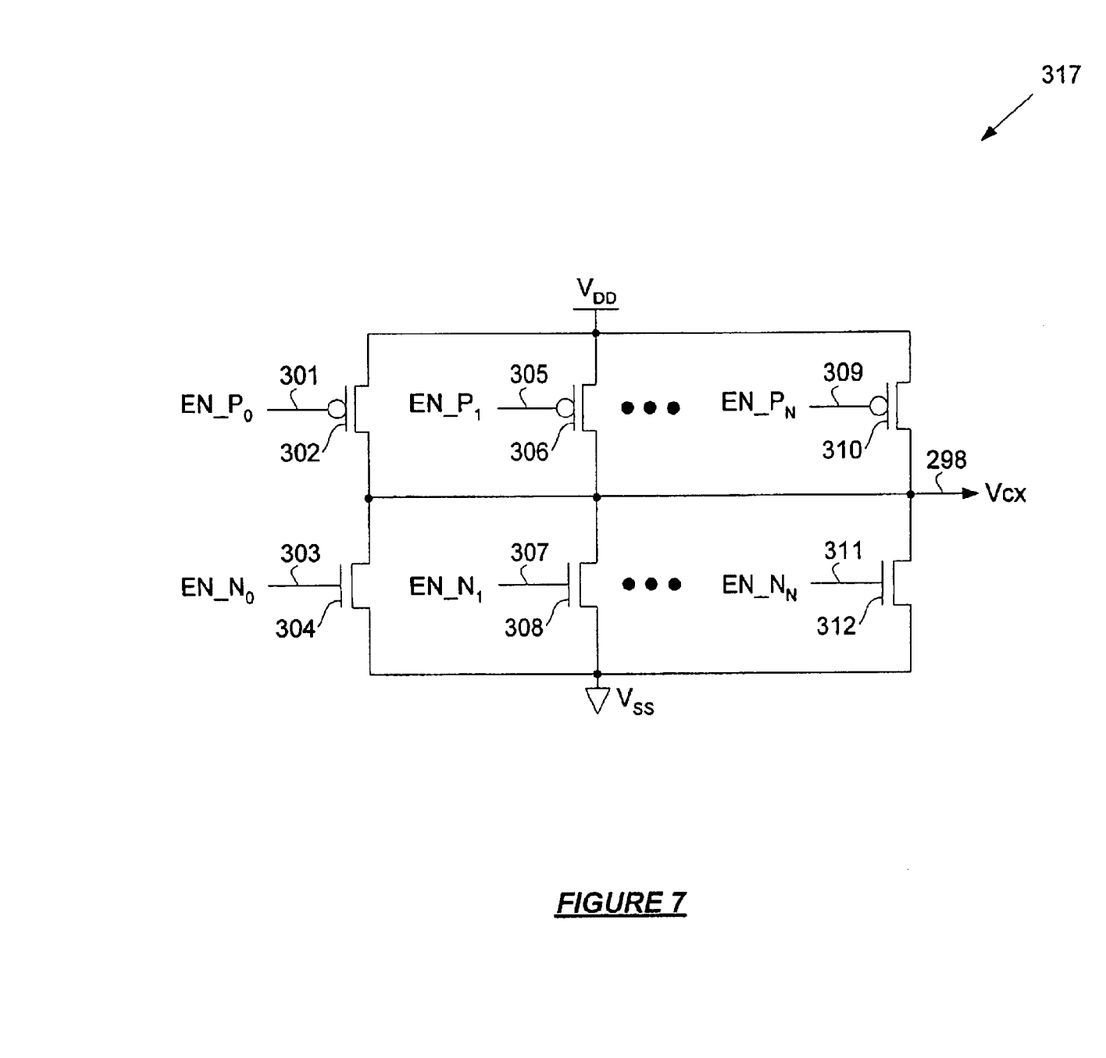
FIG. 7 shows an adjustment circuit in accordance with an embodiment of the present invention.

FIG. 7 shows an exemplary adjustment circuit 310 in accordance with an embodiment of the present invention. Those skilled in the art will understand that the adjustment circuit 310 shown in FIG. 7 is representative of the adjustment circuits 242 and 244 shown in FIG. 4.

In FIG. 7, the adjustment circuit 317 includes p-channel transistors 302, 306, and 310 arranged in parallel with each other. The p-channel transistors 302, 306, and 310 connect between a power supply, Vdd, and a common node, Vcx 298. Those skilled in the art will note that the common node Vcx 298 corresponds to Vcn 246 and Vcp 248 in FIG. 4. Still referring to FIG. 7, the adjustment circuit 317 also includes n-channel transistors 304, 308, and 312 arranged in parallel with each other. The n-channel transistors 304, 308, and 312 connect between ground, Vss, and the common node 298. The p-channel transistors 302, 306, and 310 are controlled by control signals EN_P$_0$ 301, EN_P$_1$ 305, and EN_P$_N$ 309, respectively. The n-channel transistors 304, 308, and 312 are controlled by control signals EN_N$_0$ 303, EN_N$_1$ 307, and EN_N$_N$ 311, respectively. A low voltage on any of the EN_P signals 301, 305, and 309 will turn 'on' their respective p-channel transistors 302, 306, and 310. A high voltage on any of the EN_N signals 303, 307, and 311 will turn 'on' their respective n-channel transistors 304, 308, and 312.

Any p-channel transistor 302, 306, and 310 that is 'on' will have a tendency to increase the voltage on Vcx 298 toward Vdd. Any n-channel transistor 304, 308, and 312 that is 'on' will have a tendency to lower the voltage on Vcx 298 toward Vss. By selecting which p-channel transistors 302, 306, and 310 and/or n-channel transistors 304, 308, and 312 are 'on,' a change in the voltage on Vcx 298 may be achieved.

Those with ordinary skill in the art will appreciate that the p-channel transistors 302, 306, and 310 and n-channel transistors 304, 308, and 312 may be turned 'on' individually or as a group. The p-channel transistors 302, 306, and 310 and n-channel transistors 304, 308, and 312 may be sized so that each transistor has a different effect compared to the other transistors, e.g., a transistor's gate width may be varied to adjust the strength of the transistor. The gate widths may be designed to provide a linear, exponential, or other function as more transistors are turned 'on.' The p-channel transistors 302, 306, and 310 and n-channel transistors 304, 308, and 312 may be sized so that each transistor has an inherently resistive nature, e.g., a transistor's gate length may be increased ('long-channel' transistors) to increase the inherent resistance of the transistor. A larger inherent resistance may be advantageous if both a p-channel transistor and a n-channel transistor are 'on' simultaneously. Those skilled in the art will appreciate that in other embodiments, the adjustment circuit 317 may include only one p-channel transistor and one n-channel transistor connected in series.

The k control signals 252 in FIG. 4 may represent EN_N signals 303, 307, and 311 in FIG. 7 and EN_P signals 301, 305, and 309 in FIG. 7. In other words, the k control signals 252 in FIG. 4 are used to turn 'on' or 'off' the p-channel transistors 302, 306, and 310 in FIG. 7 and n-channel transistors 304, 308, and 312 in FIG. 7.

Figure 8:
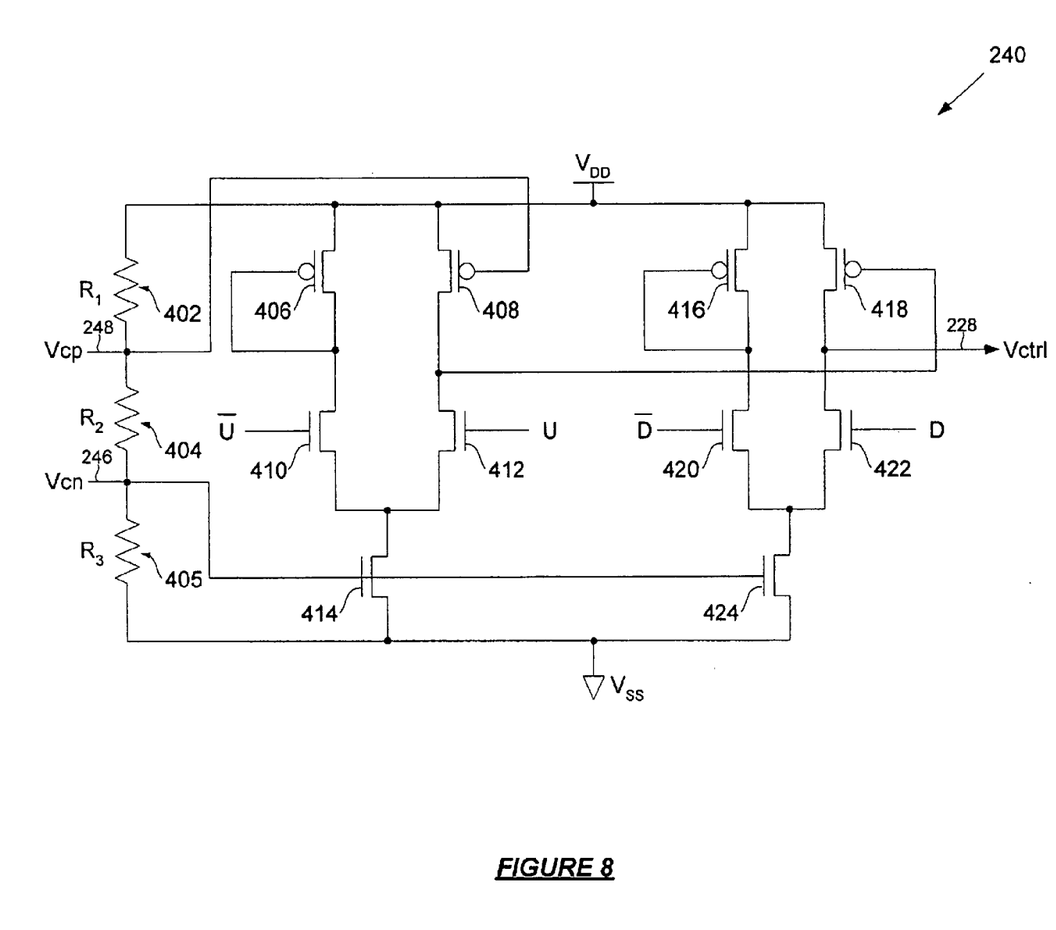
FIG. 8 shows a diagram of a charge pump in accordance with an embodiment of the present invention.

FIG. 8 an exemplary charge pump 240 in accordance with the embodiment shown in FIG. 4. The charge pump 240 includes an internal biasing circuit that is implemented using a voltage divider formed by resistors R1 402, R2 404, and R3 405. This internal biasing circuit guarantees that the charge pump 240 will have some nominal current. In order to be able to adjust the charge pump current value to achieve desired operating characteristics, the adjustment circuit control voltages Vcn 246 and Vcp 248 (also shown in FIG. 4) are operatively connected to the internal biasing circuit of the charge pump 240. Thus, depending on the values of the resistors R1 402, R2 404, and R3 405 and the adjustment circuit control voltages Vcn 246 and Vcp 248, a first differential input stage and a second differential input stage control the output, Vctrl 228, of the charge pump 240, where the first differential input stage is also responsive to UP pulses from the phase frequency detector 206 (shown in FIG. 4) and is formed by transistors 406, 408, 410, and 412, and where the second differential input stage is also responsive to DOWN pulses from the phase frequency detector 206 (shown in FIG. 4) and is formed by transistors 416, 418, 420, and 422. The current flow through the first and second differential input stage is regulated by transistors 414 and 424, respectively, where transistors 414 and 424 are responsive to the internal biasing circuit and adjustment control voltages Vcn 246 and Vcp 248.

Advantages of the present invention may include one or more of the following. A PLL, in a post-fabrication stage, i.e., after fabrication, may demonstrate operating characteristics that may not have been apparent from simulation. In one or more embodiments, because one or more adjustment circuits may be used to modify the operating characteristics of the PLL, the PLL may be calibrated.

In one or more embodiments, because a PLL may be fabricated with a means for adjusting the current output of a charge pump, fewer design iterations and higher confidence in PLL operating characteristics may be afforded. Likewise, PLL response to various system disturbances such as power supply noise and system clock signal jitter may be realistically determined and calibrated to minimize these effects.

In one or more embodiments, a tester and a test processor unit may communicate so that the state of a PLL may be obtained, performance characteristics analyzed, and/or adjustments made to the PLL. By using the tester, control information may be stored in a storage device.

In one or more embodiments, a tester may take a relatively long to determine the desired value and program control information. Because the control information is programmed, the PLL and the integrated circuit on which it resides may quickly adjust the PLL to obtain proper operation.

In one or more embodiments, a limited number of PLLs may need to be tested to determine the desired value for the control information for a larger number of PLLs.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
    a phase locked loop arranged to receive a system clock signal and output a chip clock signal, the phase locked loop comprising:
        a phase frequency detector adapted to detect a phase difference between the system clock signal and a feedback clock signal,
        a charge pump, responsive to the phase frequency detector, adapted to output a current on a control signal,
        a bias generator, responsive to the control signal, adapted to generate a bias voltage, and
        a voltage controlled oscillator, responsive to the bias voltage, adapted to generate the chip clock signal;
    an adjustment circuit of which an output is operatively connected to the charge pump, wherein current output from the charge pump is responsive to the adjustment circuit; and
    a storage device adapted to store control information, wherein the adjustment circuit is selectively responsive to the control information.

2. The integrated circuit of claim 1, wherein the control information is determined based on a state of the adjustment circuit.

3. The integrated circuit of claim 1, further comprising:
    a tester operatively connected to the storage device, wherein the tester is adapted to selectively write at least a portion of the control information to the storage device.

4. The integrated circuit of claim 3, further comprising:
    a test processor unit operatively connected to the storage device and the adjustment circuit, wherein the tester is adapted to communicate with the test processor unit.

5. The integrated circuit of claim 4, wherein the test processor unit, dependent on the tester, is adapted to selectively read at least a portion of the control information from the storage device in order to selectively adjust the adjustment circuit.

6. The integrated circuit of claim 4, wherein the test processor unit, dependent on the tester, is adapted to selectively write at least a portion of the control information to the storage device.

7. The integrated circuit of claim 1, further comprising:
    a tester operatively connected to the storage device, wherein the tester is adapted to selectively read at least a portion of the control information from the storage device.

8. The integrated circuit of claim 1, the storage device comprising at least one storage element, wherein the storage element is at least one selected from the group consisting of an electrically programmable fuse, an electrically programmable read only memory, an electrically erasable read only memory, a one-time programmable memory, a flash memory, a laser programmable fuse, and a laser programmable anti-fuse.

9. The integrated circuit of claim 1, the control information comprising a binary word.

10. The integrated circuit of claim 1, the control information comprising an instruction.

11. The integrated circuit of claim 1, the adjustment circuit comprising:
    a first device adapted to selectively control current flow between a power supply and the output of the adjustment circuit; and
    a second device adapted to selectively control current flow between the output of the adjustment circuit and ground.

12. The integrated circuit of claim 11, wherein the first device is a p-channel transistor and the second device is an n-channel transistor, and wherein the p-channel transistor and the n-channel transistor are arranged in series.

13. The integrated circuit of claim 11, the adjustment circuit comprising a third device arranged in parallel with the first device.

14. The integrated circuit of claim 11, the adjustment circuit comprising a third device arranged in parallel with the second device.

15. The integrated circuit of claim 1, wherein the feedback clock signal is responsive to the chip clock signal.

16. An integrated circuit, comprising:
  phase locked loop means for receiving an input clock signal and outputting an output clock signal, the phase locked loop means comprising:
    comparing means for detecting a phase difference between the input clock signal and a feedback clock signal,
    charge pumping means, responsive to the comparing means, for outputting a current on a control signal,
    bias generating means, responsive to the control signal, for generating a bias voltage, and
    oscillating means, responsive to the bias voltage, for outputting the output clock signal;
  adjusting means for adjusting the current output of the charge pumping means; and
  storing means for storing control information to which the adjusting means is selectively responsive.

17. A method for post-fabrication treatment of a phase locked loop, comprising:
  detecting a phase difference between an input clock signal and a feedback clock signal of the phase locked loop;
  generating a current on a control signal based on the detected phase difference;
  generating a bias voltage based on the control voltage;
  generating an output clock signal based on the bias voltage;
  selectively adjusting the current on the control signal in response to a measured operating characteristic of the phase locked loop, the measured operating characteristic being independent of external control of the feedback clock signal; and
  storing at least a portion of control information determined from the selectively adjusting in a storage device.

18. The method of claim 17, wherein the at least a portion of the control information is determined based on a state of an adjustment circuit.

19. The method of claim 17, the storage device comprising a storage element, the storage element being at least one selected from the group consisting of an electrically programmable fuse, an electrically programmable read only memory, an electrically erasable read only memory, a one-time programmable memory, a flash memory, a laser programmable fuse, and a laser programmable anti-fuse.

20. The method of claim 17, wherein the feedback clock signal is dependent on the output clock signal.

21. A method for post-fabrication treatment of a phase locked loop, comprising:
  detecting a phase difference between an input clock signal and a feedback clock signal of the phase locked loon;
  generating a current on a control signal based on the detected phase difference;
  generating a bias voltage based on the control voltage;
  generating an output clock signal based on the bias voltage;
  selectively adjusting the current on the control signal; and
  storing at least a portion of control information determined from the selectively adjusting in a storage device,
  wherein the selectively adjusting is based on the at least a portion of the control information, wherein the selectively adjusting uses an adjustment circuit, the selectively adjusting comprising:
    controlling a first current flow between a power supply and an output of the adjustment circuit; and
    controlling a second current flow between the output of the adjustment circuit and ground.

* * * * *

UNITED STATES PATENT AND TRADEMARK OFFICE
CERTIFICATE OF CORRECTION

PATENT NO. : 6,768,955 B2  Page 1 of 1
DATED : July 27, 2004
INVENTOR(S) : Claude R. Gauthier et al.

It is certified that error appears in the above-identified patent and that said Letters Patent is hereby corrected as shown below:

Column 12,
Line 21, please replace "loon" with -- loop --.

Signed and Sealed this

Eighth Day of February, 2005

JON W. DUDAS
*Director of the United States Patent and Trademark Office*